United States Patent [19]

Kim

[11] Patent Number: 5,581,300
[45] Date of Patent: Dec. 3, 1996

[54] SOLID STATE IMAGE SENSOR ARRAY HAVING PHOTOCHROMIC LAYER SURROUNDED BY PASSIVE LAYER FOR MULTIPLE PHOTOELECTRIC CONVERSION ELEMENTS IN THE ARRAY

[75] Inventor: Sung E. Kim, Seoul, Rep. of Korea

[73] Assignee: Goldstar Co., Ltd., Seoul, Rep. of Korea

[21] Appl. No.: 329,789

[22] Filed: Oct. 27, 1994

Related U.S. Application Data

[63] Continuation of Ser. No. 950,662, Sep. 25, 1992, abandoned.

[30] Foreign Application Priority Data

Sep. 27, 1991 [KR] Rep. of Korea ............... 16933/1991

[51] Int. Cl.$^6$ ............... H04N 5/335; H04N 3/14
[52] U.S. Cl. ............... 348/297; 348/207; 348/340; 348/902; 348/273
[58] Field of Search ............... 348/207, 340, 348/294, 297, 298, 335, 902, 273, 274; 250/208.1, 226; 359/241

[56] References Cited

U.S. PATENT DOCUMENTS

| | | | |
|---|---|---|---|
| 3,225,138 | 12/1965 | Montani | 358/902 |
| 3,579,252 | 3/1971 | Goodman | 348/902 |
| 3,703,660 | 11/1972 | Fyler | 348/902 |
| 4,404,586 | 9/1983 | Tabei | 348/280 |
| 4,438,455 | 3/1984 | Tabei | 358/44 |
| 4,695,717 | 9/1987 | Hirai et al. | 250/213 R |
| 5,204,762 | 4/1993 | Kawai | 358/474 |
| 5,289,286 | 2/1994 | Nakamura | 348/251 |

FOREIGN PATENT DOCUMENTS

| | | | |
|---|---|---|---|
| 2-76481 | 3/1990 | Japan | H04N 5/238 |
| 1266777 | 3/1972 | United Kingdom | G02B 5/20 |

OTHER PUBLICATIONS

Paul Galland and Edward Lipson. 21 Aug. 1984.
Action Spectra for Phototropic balance in *Phycomyces blakesleeanus:* dependence on reference Wavelength and intensity range. (Abstract).

J. Verborgt and G. Smets, Photochromic behavior of Copolymers of Indolinospirobenzopyrane Methacrylic derivatives 1974.

Keiji Tanaka Mar. 31, 1987 Light intensity dependence of Photodarkening in Amorphous $As_2S_3$ Films.

*Primary Examiner*—Michael T. Razavi
*Assistant Examiner*—Bipin Shalwala

[57] ABSTRACT

A solid state image sensor is provided having a vertical charge transfer unit, a horizontal charge transfer unit, a photoelectric conversion unit including a plurality of photoelectric conversion elements arranged in a matrix manner, each photoelectric conversion element having a photodiode and switching MOS transistors to output a signal accumulated in the photodiode, and a charge accumulation controller for controlling a charge accumulated by each photodiode in logarithmical proportion to the quantity of light incident on each corresponding photoelectric conversion element corresponding to one pixel. The charge accumulation controller includes a photochromic color filter layer made of a photochromic material. Alternatively, the charge accumulation controller includes a photochromic layer which is formed over an existing color filter layer at a light receiving window area. With this construction, the quantity of light incident on a surface to be image-scanned is not controlled based on the average illumination of an image, but based on the unit of the photoelectric conversion element corresponding to one pixel. Accordingly, it is possible to prevent degradation in image quality at dark areas relative to light areas upon photographing an object including the dark and light areas.

4 Claims, 5 Drawing Sheets

SOLID STATE IMAGE SENSOR ARRAY HAVING PHOTOCHROMIC LAYER SURROUNDED BY PASSIVE LAYER FOR MULTIPLE PHOTOELECTRIC CONVERSION ELEMENTS IN THE ARRAY

This application is a continuation of application Ser. No. 07/950,662 filed on Sep. 25, 1992, now abandoned.

BACKGROUND OF THE INVENTION

1. Field of the Invention

The present invention relates to solid state image sensors, and more particularly to solid state image sensors capable of preventing degradation in image quality at dark areas relative to light areas upon photographing an object including the dark and light areas.

2. Description of the Related Art

Generally, solid state image sensors include a plurality of photoelectric conversion elements arranged in a matrix manner. Each photoelectric conversion element corresponds to each pixel and generates a signal charge proportional to the quantity of incident light. A pixel signal generated by each photoelectric conversion element is extracted via a metal oxide semiconductor (MOS) transistor, so as to pick up an image of an object.

Such solid state image sensors are classified into two types, one type being a charge coupled device (CCD) type and the other type being a MOS type. The MOS type solid state image sensor uses a photodiode as each source region thereof.

The CCD type solid state image sensor has a photosensor disposed at the lower surface of its electrode. On the other hand, the MOS type solid state image sensor has a photosensor disposed in flush with a switch and a signal output line. Such photosensors can be manufactured by using a MOS process technique for achieving a high integration.

The present invention is directed to a solid state image sensor of the NOS type constituted by a combination of a photodiode and a switching MOS transistor.

Figure 1:
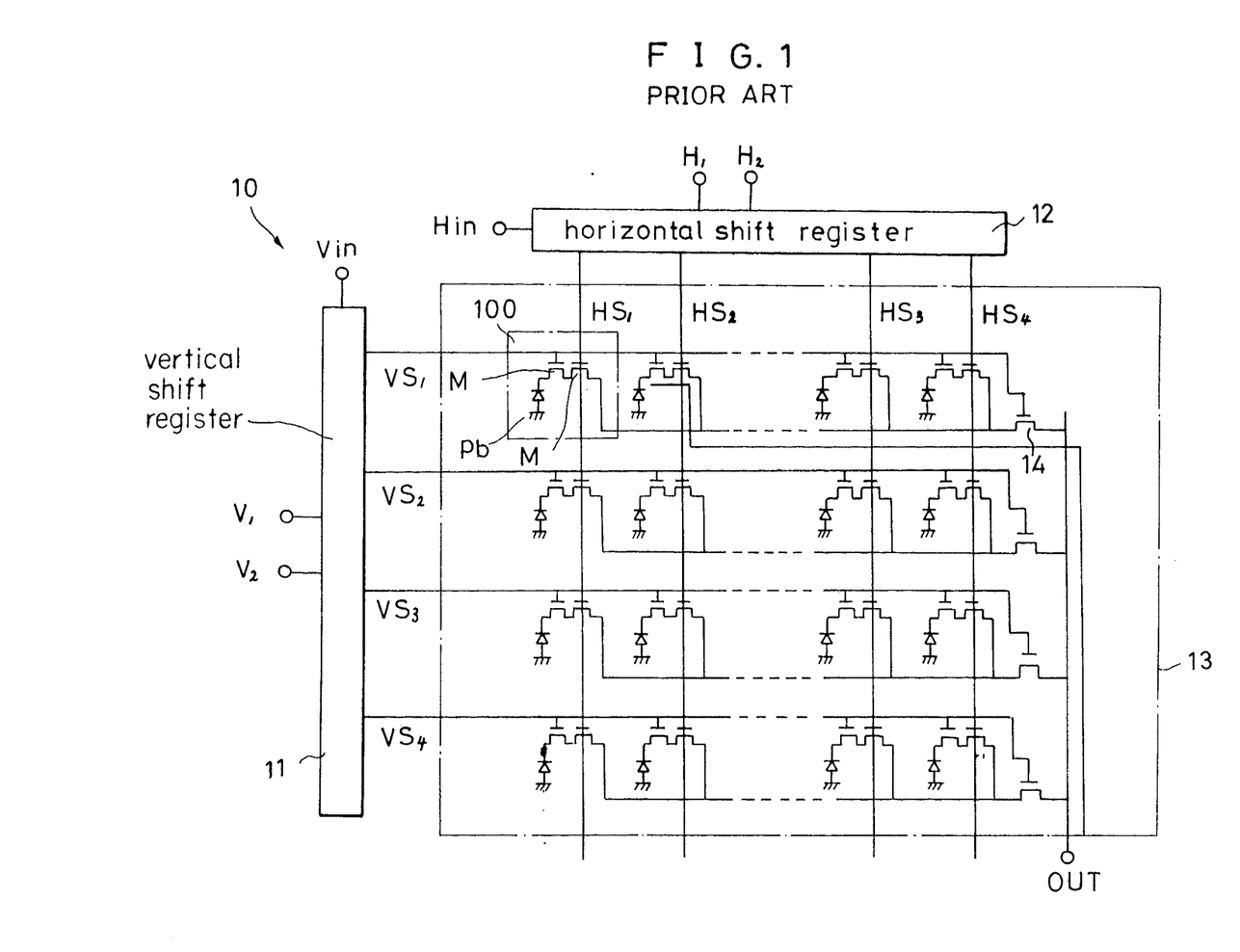
FIG. 1 is a circuit diagram of a conventional solid state image sensor.

Referring to FIGS. 1 to 5, there is illustrated a MOS type color image sensor as an example of a conventional solid state image sensor. FIG. 1 is a circuit diagram of the conventional solid state image sensor. As shown in FIG. 1, the solid state image sensor which is denoted by the reference numeral 10 mainly includes a vertical charge transfer unit 11 for generating vertical scanning signals VS1 to VS4 in response to input signals V1 and V2, a horizontal charge transfer unit 12 for generating horizontal scanning signals HS1 to HS4 in response to input signals H1 and H2, and a photoelectric conversion unit 13 including a plurality of photoelectric conversion elements 100 arranged in a matrix manner, each photoelectric conversion element having a photodiode PD and MOS transistors M1 and M2 controllably switched by the vertical and horizontal scanning signals rS1 to rS4 and HS1 to HS4.

Each photoelectric conversion element 100 of the photoelectric conversion unit 13 corresponds to each pixel and serves as a pixel cell for generating a charge proportional to the quantity of light incident on each corresponding pixel, so as to pick up an image of an object. The MOS transistor M1 of each pixel cell has a gate to which vertical scanning signals VS1 to VS4 are applied. On the other hand, the MOS transistor M2 has a gate to which horizontal scanning signals HS1 to HS4 are applied.

In FIG. 1, the photoelectric conversion unit 13 illustrated as having pixel cells arranged in 4 columns and 4 rows. As shown in FIG. 1, horizontal scanning signals HS1 to HS4 outputted from the horizontal charge transfer unit 12 are applied to gate terminals of MOS transistors M2 of photoelectric conversion elements 100 arranged transversely in each row, respectively. On the other hand, vertical scanning signals VS1 to rS4 outputted from the vertical charge transfer unit 11 are applied to gate terminals of MOS transistors M1 of photoelectric conversion elements 100 arranged longitudinally in each column, respectively. The photoelectric conversion unit 13 also includes switching MOS transistors 14 for selecting a vertical position of each corresponding pixel. The switching MOS transistors 14 are coupled in common to an output terminal OUT of the photoelectric conversion unit 13

Figure 2:
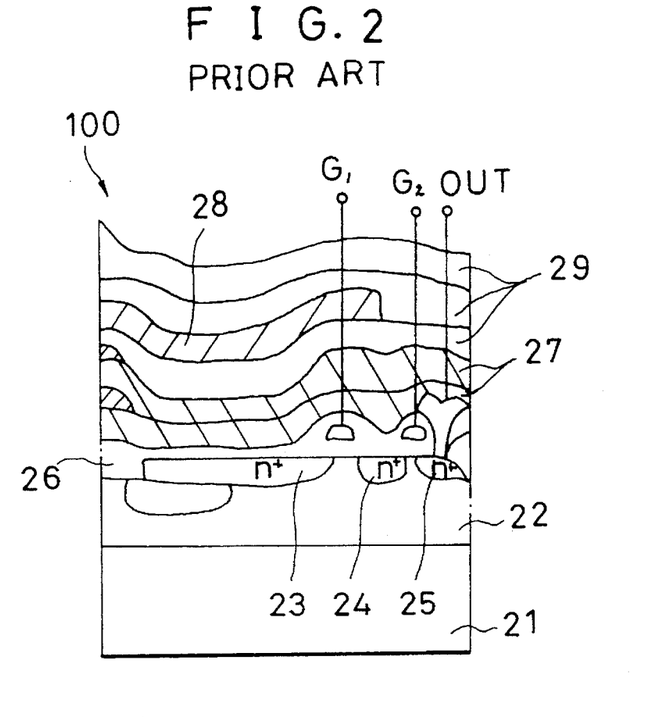
FIG. 2 is a sectional view of a photoelectric conversion element corresponding to one pixel in the solid state image sensor shown in FIG. 1.
Figure 3:
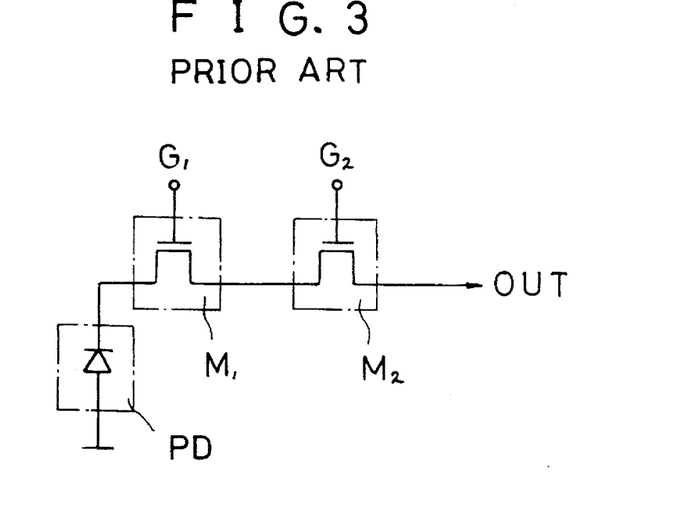
FIG. 3 is a circuit diagram of an equivalent circuit of the photoelectric conversion element shown in FIG. 2.

FIG. 2 is a sectional view of each photoelectric conversion element 100 corresponding to one pixel in the photoelectric conversion unit 13 shown in FIG. 1. FIG. 3 is a circuit diagram of an equivalent circuit of the photoelectric conversion element shown in FIG. 2.

In the photoelectric conversion element 100 corresponding to one pixel, the photodiode PD grounded at its anode is coupled to the source of the MOS transistor M1, as shown in FIG. 3. To the gate G1 of the MOS transistor M1 is applied a vertical scanning signal, for example, VS1, from the vertical charge transfer unit 11. The MOS transistor M1 is also coupled at its drain to the source of the MOS transistor M2. The MOS transistor M2 receives at its gate G2 a horizontal scanning signal, for example, HS1, from the horizontal charge transfer unit 12 and is coupled at its drain to the output terminal OUT of the photoelectric conversion unit 13.

Now, the structure of the photoelectric conversion element 100 having the above-mentioned equivalent circuit will be described in conjunction with FIG. 2.

The photoelectric conversion element 100 includes a N type substrate 21 and a P type well 22 formed on the N type substrate 21 and serving as a drain of the MOS transistor M1 and a source of the MOS transistor M2. In the P type well 22, a first impurity region 23 of the N type serving as a cathode of the photodiode PD and a source of the MOS transistor MI, a second impurity region 24 of the N type serving as a drain of the MOS transistor M1 and a source of the MOS transistor M2, and a third impurity region 25 of the N type serving as a drain of the MOS transistor M2. The gate G1 of MOS transistor M1 is formed between the first impurity region 23 and the second impurity region 24 above the N-type substrate 21 and insulated by an oxide film 26 formed over the P type well 22. In a similar manner, the gate G2 of MOS transistor M2 is formed between the second impurity region 24 and the third impurity region 25 above the N-type substrate 21 and insulated by the oxide film 26. Over the oxide film 26 is formed an insulating phosphorous silicate glass (PSG) film 27 which is, in turn, covered with a color filter layer 28 surrounded by a passive film 29.

A procedure that the solid state image sensor with the above-mentioned structure scan an object and generate video signals will now be described.

First, as light enters each photodiode PD, a charge proportional to the quantity of the incident light is generated and then accumulated in the photodiode PD. This phenomenon occurs simultaneously at all photodiodes PD of photoelectric conversion elements. Totally, the quantities of signal charges accumulated in photodiodes PD are proportional to the luminosities of incident images through a lens, respectively.

After completing the charge accumulation in photodiodes PD, the charges accumulated in the photodiodes PD are read out through the switching MOS transistors M1 and M2 coupled to specific ones of a plurality of pixels according to control signals H1, H2, Hin, V1, V2 and Vin, so that a video signal of one field is obtained.

Figure 4:
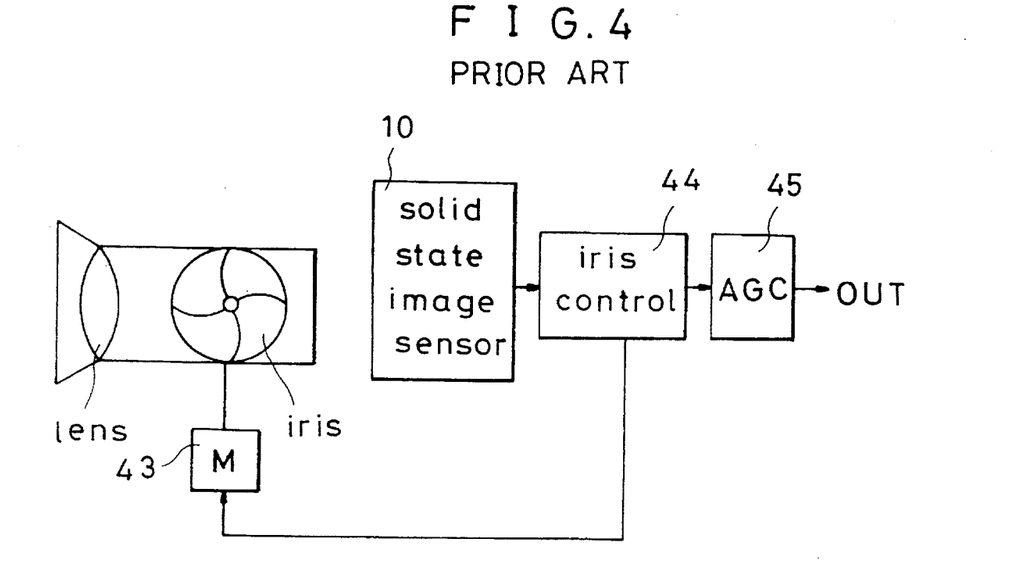
FIG. 4 is a block diagram of a conventional camera system.

Referring to FIG. 4, there is illustrated an example of a camera system utilizing such a solid state image sensor. As shown in FIG. 4, the camera system includes a lens 41, an iris 42, a motor 43 adapted to open and close the iris 42, an iris control unit 44 adapted to detect the average illuminance of the picked-up image and drive the motor 43 so that the iris 42 is opened or closed properly to make the average illuminance correspond to a predetermined value, and an automatic gain control (AGC) unit 45 adapted to operate when a video signal generated after the control operation of the iris control unit 44 is at a level not higher than a predetermined illuminance level, so as to provide a proper gain.

Generally, the illuminance in the natural world in which most objects for video cameras are presented ranges from $10^{-4}$ 1x (Lux) near darkness to $10^5$ 1x of direct rays of sun light. On the other hand, the photodiodes have a dynamic range of a $10^1$ grade due to limitations such as characteristics of materials used and the size of a pixel. Because such image sensors have difficulties in directly picking up an image of an object of the natural world, the existing camera systems utilize control devices such as the iris control unit 44 or the AGC unit 45, so as to cope with the broad range of the illuminance in the natural world.

Figure 5:
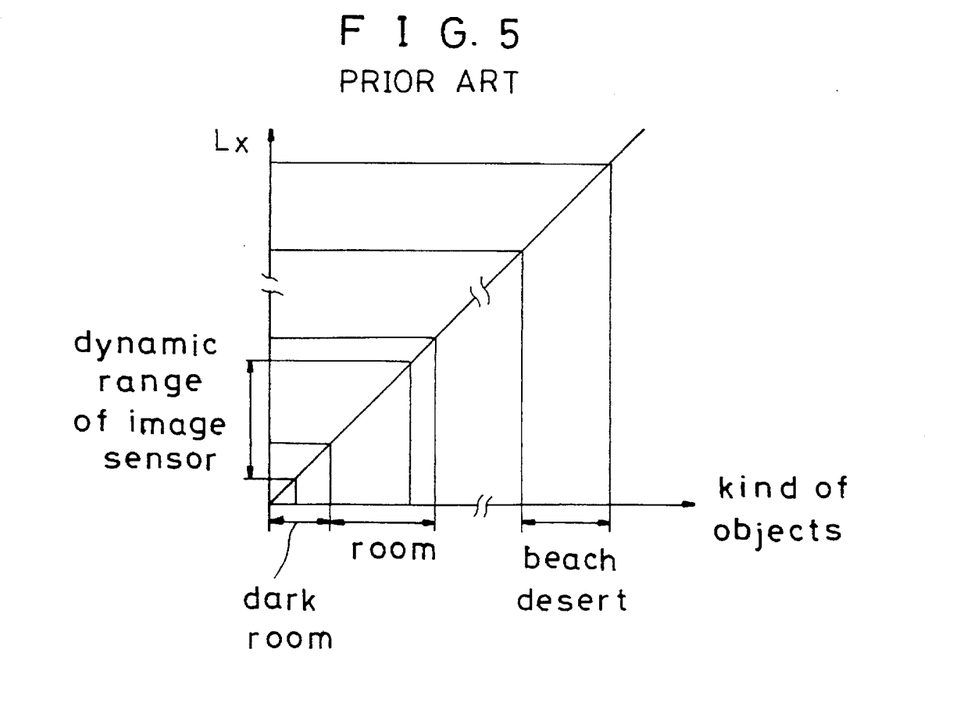
FIG. 5 is a graph illustrating the relation between the illuminance of an object and a dynamic range of a conventional image sensor.

However, the basic assumption in such systems is that objects in the natural world are presented within a specific range of the illuminance. In other words, images in places such as a desert and a beach are presented within a high illuminance range above a predetermined value. On the other hand, the images in places such as rooms are presented within a lower illuminance range. As shown in FIG. 5, objects at a beach can be controlled to cope with the dynamic range of an image sensor, by reducing totally the illuminance of the images being picked up by the image sensor. In the existing camera systems, such a control function is achieved only by the iris 42. In a dark room, a totally dark image is obtained even when the iris is fully opened. In this case, accordingly, the AGC unit 45 operates to increase the gain for a video signal so that the video signal has a proper illuminance. The above-mentioned camera systems can exhibit a superior performance for objects whose images are presented within a specific illuminance range.

However, the illuminance condition of objects presented in the natural world is considerably various, beyond the cases mentioned above. For example, there is a back light condition. The back light condition is the case that a part of an image is very light.

In such a back light condition, an image includes both a low illuminance condition, for example, in a room and a high illuminance condition, for example, of sun light or other light sources. In this case, it can be found that the illuminance range of an object exceeds considerably the dynamic range of the image sensor. Under this condition, a severe degradation in image quality occurs at the low illuminance part of the image due to limitations in the photoelectric conversion elements, although the iris 42 and the AGC unit 45 control properly the quantity of light incident on the image sensor. Such a problem cannot be solved by the existing systems wherein a control value for the quantity of light is calculated based on the average illuminance of an object, although the existing image sensors have an illuminance condition capable of obtaining a sufficiently good image by virtue of efforts to develop image sensors of a high sensitivity.

SUMMARY OF THE INVENTION

Therefore, an object of the invention is to solve the above-mentioned problems encountered in the known systems and to provide a solid state image sensor wherein a photoelectric conversion element corresponding to each pixel has control means for controlling logarithmically the quantity of charge accumulated in a photodiode, based on the quantity of light, thereby preventing a degradation in image quality, In one aspect, the present invention provides a solid state image sensor comprising a vertical charge transfer unit for generating vertical scanning signals in response to input signals, a horizontal charge transfer unit for generating horizontal scanning signals in response to input signals, and a photoelectric conversion unit including a plurality of photoelectric conversion elements arranged in a matrix manner, each of said photoelectric conversion elements having a photodiode adapted to accumulate a signal corresponding to light incident thereon and first and second switching MOS transistors controllably switched by the vertical and horizontal scanning signals to generate a video signal corresponding to said signal accumulated in said photodiode, characterized in that each of said photoelectric conversion elements comprises: a substrate of a first conductivity type; a well of a second conductivity type formed on the first conductivity type substrate; first to third impurity regions of the first conductivity type formed in said well and serving as sources and drains of the photodiode and said first and second switching MOS transistors; a gate for the first switching MOS transistor formed between said first impurity region and said second impurity region above the substrate and insulated by an oxide film formed over the well, said gate receiving a corresponding one of the vertical scanning signals; a gate for the second switching MOS transistor formed between the second impurity region and the third impurity region above the substrate and insulated by the oxide film, said gate receiving a corresponding one of the horizontal scanning signals; an insulating phosphorous silicate glass film formed over the oxide film; and a photochromic color filter layer of a photochromic material surrounded by a passive film, In another aspect, the present invention provides a solid state image sensor comprising a vertical charge transfer unit for generating vertical scanning signals in response to input signals, a horizontal charge transfer unit for generating horizontal scanning signals in response to input signals, and a photoelectric conversion unit including a plurality of photoelectric conversion elements arranged in a matrix manner, each of said photoelectric conversion elements having a photodiode adapted to accumulate a signal corresponding to a light incident thereon and first and second switching MOS transistors controllably switched by the vertical and horizontal scanning signals to generate a video signal corresponding to said signal accumulated in said photodiode, characterized in that each of said photoelectric conversion elements comprises: a substrate of a first conductivity type; a well of a second conductivity type formed on the first conductivity type substrate; first to third impurity regions of the first conductivity type formed in said well and serving as sources and drains of the photodiode and said first and second switching MOS transistors; a gate for the first switching MOS transistor formed between said first impurity region and said second impurity region above the substrate and insulated by an oxide film formed over the well, said gate receiving a corresponding one of the vertical scanning signals; a gate for the second switching MOS transistor formed between the second impurity region and the third impurity region above the substrate and insulated by the oxide film, said gate receiving a corresponding one of the horizontal scanning signals; an insulating phosphorous silicate glass film formed over the oxide film; a color filter layer formed over said phosphorous silicate glass film and surrounded by a passive film; and a photochromic layer formed over said color filter layer and surrounded by a passive film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

The present invention provides a solid state image sensor wherein a photoelectric conversion element corresponding to each pixel has a controller for controlling logarithmically the quantity of charge accumulated in a photodiode, based on the quantity of light. With this construction, the quantity of light incident on a surface to be image-scanned is not controlled based on the average illuminance of an image, but based on every pixel. Accordingly, it is possible to prevent degradation in image quality at dark areas relative to light areas upon photographing an object including the dark and light areas.

Figure 6:
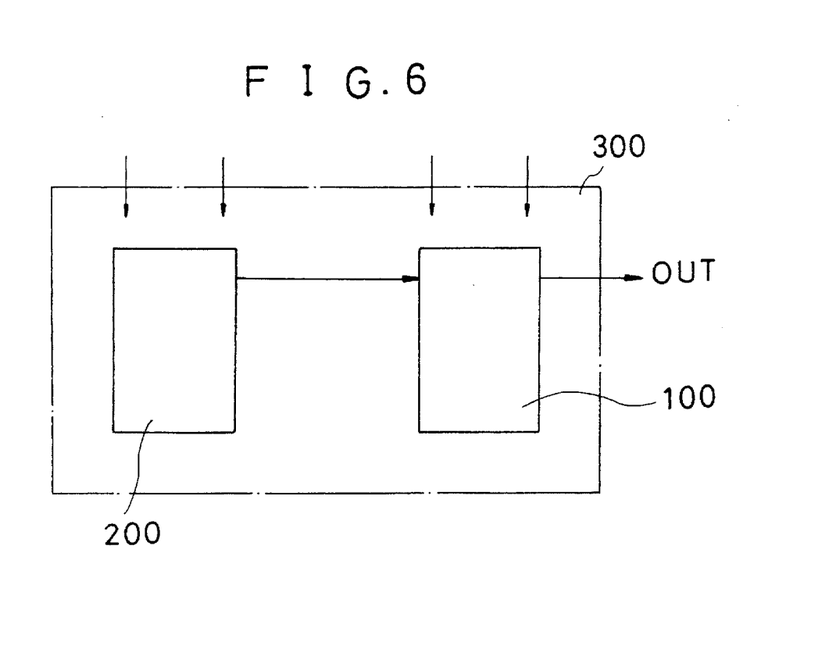
FIG. 6 is a block diagram of a construction corresponding to one pixel in a solid state image sensor in accordance with an embodiment of the present invention.

Referring to FIG. 6, there is illustrated one of a plurality of photoelectric conversion elements constituting a photoelectric conversion unit of the solid state image sensor according to an embodiment of the present invention, As shown in FIG. 6, each photoelectric conversion element which corresponds to one pixel and is denoted by the reference numeral 300 includes a photoelectric element 100 of the conventional type and a charge accumulation a controller 200 for controlling logarithmically the quantity of charge accumulated in a photodiode of the photoelectric element 100, based on the quantity of light.

Figure 7:
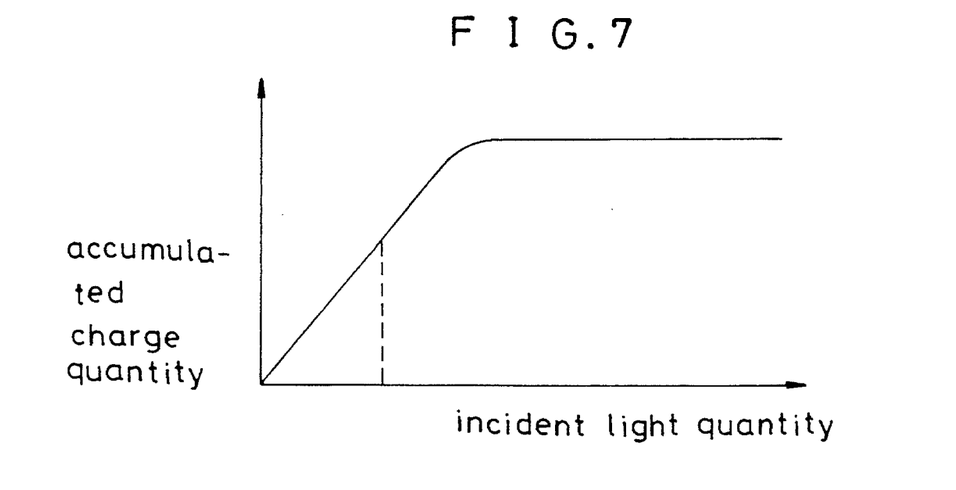
FIG. 7 is a graph illustrating the relation between the quantity of incident light and the quantity of accumulated charge in accordance with an embodiment of the present invention.

FIG. 7 shows a graph illustrating the relation between the quantity of incident light and the quantity of accumulated charge. By referring to FIG. 7, it can be found that the quantity of charge accumulated in the photodiode of the photoelectric element 300 is controlled in logarithmical proportion to the quantity of incident light under the control of the charge accumulation controller 200.

Figure 8:
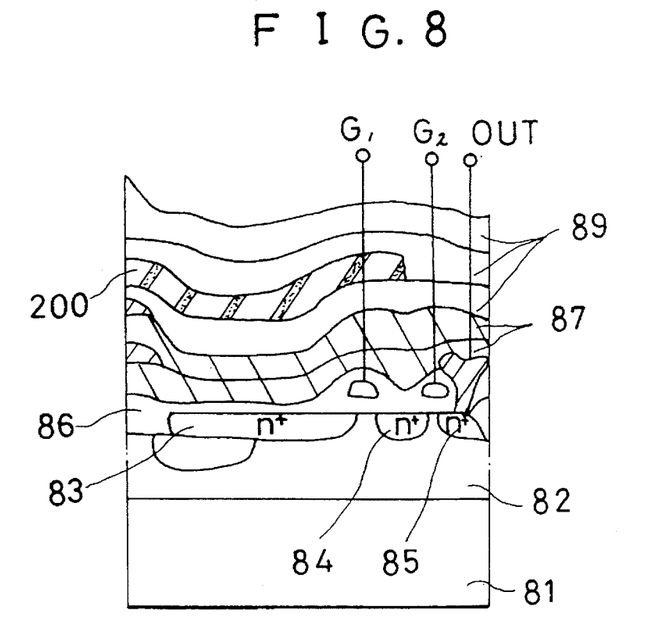
FIG. 8 is a sectional view of a photoelectric conversion element corresponding to one pixel in accordance with a first embodiment of the present invention.

Referring to FIG. 8, there is illustrated a sectional view of the structure of the photoelectric conversion element corresponding to one pixel in accordance with a first embodiment of the present invention. As shown in FIG. 8, the photoelectric conversion element 300 includes a N type substrate 81 and a P type well 82 formed on the N type substrate 81. In the P type well 82 are formed a first impurity region 83, a second impurity region 84 and a third impurity region 85, all being of the N type. A gate G1 is formed between the first impurity region 83 and the second impurity region 84 above the N-type substrate 81. The gate G1 is insulated by an oxide film 86 formed over the P type well 82. In a similar manner, a gate G2 is formed between the second impurity region 84 and the third impurity region 85 above the N-type substrate 81 and insulated by the oxide film 86. Over the oxide film 86 is formed an insulating PSG film 87 which is, in turn, covered with a photochromic color filter layer 200 of a photochromic material surrounded by a passive film 89.

Each photoelectric conversion element 300 corresponding to one pixel includes one photodiode and two switching MOS transistors. As shown in FIG. 8, the first impurity region 83 of the N type is coupled to the P type well 82, so as to form the photodiode. A first switching MOS transistor is constituted by the first and second impurity regions 83 and 84 of the N type, the P type well 82 and the gate G1. On the other hand, a second switching MOS transistor is constituted by the second and third impurity regions 84 and 85, the P type well 82 and the gate G2.

Figure 9:
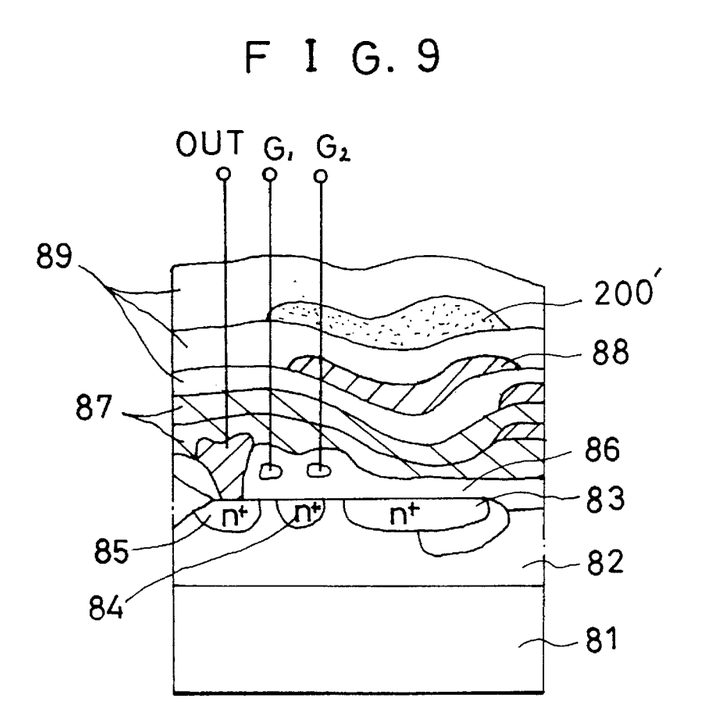
FIG. 9 is a sectional view of a photoelectric conversion element corresponding to one pixel in accordance with a second embodiment of the present invention.

Referring to FIG. 9, there is illustrated a sectional view of the structure of the photoelectric conversion element corresponding to one pixel in accordance with a second embodiment of the present invention. The photoelectric conversion element of the second embodiment has the same structure as the photoelectric conversion element of the first embodiment, except for including a color filter layer 88 of the conventional type as shown in FIG. 2 and a photochromic layer 200' formed separately from the color filter layer 88 by means of a passive film 89. In FIG. 9, the same reference numerals as those in FIG. 8 denote the same elements.

That is, the charge accumulation controller 200 according to the first embodiment of the present invention comprises a photochromic layer which is obtained by forming a color filter layer positioned at a light transmitting area by a photochromic material. On the other hand, the charge accumulation controller 200' according to the second embodiment of the present invention includes a photochromic layer which is formed over an existing color filter layer at a light receiving window area constituting a pixel.

The photochromic material is a material having a characteristic of becoming discolored upon receiving light and decolorized upon a reduction in the quantity of light. The photochromic material is made of mineral glass which has been added halogen silver particles. Such a photochromic material is used as a material for producing a plastic material.

The characteristic of the solid state image sensor of the present embodiment is that although the solid state image sensor of the present embodiment has the same external construction as the existing color solid state image sensors and the same equivalent circuit of one pixel, the solid state image sensor of the present embodiment has a photochromic color filter layer made of a photochromic material as a color filter layer disposed at a light transmitting area of each photoelectric conversion element or formed at a light receiving window area, separately from the color filter layer, so that the quantity of light incident on a surface to be image-scanned is not controlled based on the average illuminance of the image, but it is controlled based on every pixel. That is, the charge accumulation controller 200 functions to make the photoelectric conversion element receive fully the incident light so as not to degrade the minimum illuminance characteristic of the image sensor when the quantity of light incident on each pixel is small. On the other hand, when the total illuminance of an object is high or a specific part of the image is picked up at a high illuminance, the charge accumulation controller 200 functions to shield the quantity of light incident on the photoelectric conversion element over a predetermined light quantity, according to the characteristic curve of FIG. 7, and thus controls the quantity of accumulated charge.

Thus, a video signal outputted from the image sensor is in the form of having an amplitude compressed in reverse and proportional to the incident light at each area corresponding to each photoelectric conversion element.

In the case of an object having a broad illuminance range, therefore, the signal in the form of compressing a high illuminance portion by the unit of a photoelectric conversion element, that is, by the unit of a pixel makes it possible to calculate the opening and closing amount of the iris 42 in the iris control unit 44 of the camera system of FIG. 4 or other camera systems such as camcoders, movie cameras and still cameras. This also improves the charge accumulation condition at a low illuminance part of the image.

As apparent from the above description, the embodiments of the present invention provide a solid state image sensor capable of controlling the quantity of charge accumulated in each photodiode, based on the quantity of light incident on each photoelectric conversion element, as compared with the existing camera systems wherein the total illuminance of image is determined by an iris or AGC unit. Accordingly, the embodiments of the present invention provide an improvement in image quality for a low illuminance part of an object under an illuminance condition (for example, a back light condition) beyond the dynamic range of the image sensor. According to an improvement in light controlling capability, it is also possible to reconsider the necessity of the iris. Where the image sensor of the present invention is applied to the existing camera systems, the reliance is improved.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A solid state image sensor comprising:
   a vertical charge transfer unit for generating vertical scanning signals in response to vertical input signals;
   a horizontal charge transfer unit for generating horizontal scanning signals in response to horizontal input signals; and
   a photoelectric conversion unit having a plurality of photoelectric conversion elements arranged in an array, multiple ones of said photoelectric conversion elements each including
      a photodiode adapted to accumulate a signal corresponding to light incident thereon,
      first and second switching MOS transistors controllably switched by said vertical and horizontal scanning signals to generate a video signal corresponding to said signal accumulated in said photodiode,
      a substrate of a first conductivity type,
      a well of a second conductivity type formed on said substrate of said first conductivity type,
      first, second and third impurity regions of said first conductivity type formed in said well and serving as sources and drains of said photodiode and said first and second switching MOS transistors,
      a first gate of said first switching MOS transistor formed between said first impurity region and said second impurity region above said substrate and insulated by an oxide film formed over said well, said first gate receiving a corresponding one of said vertical scanning signals,
      a second gate of said second switching MOS transistor formed between said second impurity region and said third impurity region above said substrate and insulated by said oxide film, said second gate receiving a corresponding one of said horizontal scanning signals,
      an insulating phosphorous silicate glass film formed over said oxide film, and
      a photochromic color filter layer of a photochromic material positioned at a light transmitting area and surrounded by a passive film.

2. A solid state image sensor in accordance with claim 1, wherein each said photochromic color filter layer is adapted to control logarithmically the quantity of charge accumulated in said first impurity region, based on the quantity of light incident thereon.

3. A solid state image sensor comprising:
   a vertical charge transfer unit for generating vertical scanning signals in response to vertical input signals;
   a horizontal charge transfer unit for generating horizontal scanning signals in response to horizontal input signals; and
   a photoelectric conversion unit having a plurality of photoelectric conversion elements arranged in an array, multiple ones of said photoelectric conversion elements each including
      a photodiode adapted to accumulate a signal corresponding to a light incident thereon,
      first and second switching MOS transistors controllably switched by said vertical and horizontal scanning signals to generate a video signal corresponding to said signal accumulated in said photodiode,
      a substrate of a first conductivity type,
      a well of a second conductivity type formed on said substrate of said first conductivity type,
      first, second and third impurity regions of said first conductivity type formed in said well and serving as sources and drains of said photodiode and said first and second switching MOS transistors,
      a first gate of said first switching MOS transistor formed between said first impurity region and said second impurity region above said substrate and insulted by an oxide film formed over said well, said first gate receiving a corresponding one of said vertical scanning signals, a second gate of said second switching MOS transistor formed between said second impurity region and said third impurity region above said substrate and insulated by said oxide film, said second gate receiving a corresponding one of said horizontal scanning signals, an insulating phosphorous silicate glass film formed over said oxide film, a color filter layer formed over said phosphorous silicate glass film and surrounded by a passive film, and a photochromic layer formed over said color filter layer at a light receiving window area and surrounded by said passive film.

4. A solid state image sensor in accordance with claim 3, wherein each said photochromic layer is adapted to control logarithmically the quantity of charge accumulated in said first impurity region, based on the quantity of light incident thereon.

* * * * *